United States Patent [19]

Losee et al.

[11] Patent Number: 5,084,749
[45] Date of Patent: Jan. 28, 1992

[54] IMAGE SENSING DEVICE WITH REDUCED SMEAR

[75] Inventors: David L. Losee, Fairport; Madhav Mehra, Rochester, both of N.Y.

[73] Assignee: Eastman Kodak Company, Rochester, N.Y.

[21] Appl. No.: 644,164

[22] Filed: Jan. 22, 1991

Related U.S. Application Data

[63] Continuation-in-part of Ser. No. 570,185, Aug. 20, 1990, abandoned, which is a continuation-in-part of Ser. No. 236,413, Aug. 25, 1988, abandoned.

[51] Int. Cl.$^5$ .............. H01L 27/14; H01L 31/00; H01L 29/71; H01L 29/06
[52] U.S. Cl. ............................ 357/30; 357/19; 357/23.11; 357/24
[58] Field of Search .............. 357/30, 30 L, 19, 23.11

[56] References Cited

U.S. PATENT DOCUMENTS

| | | | |
|---|---|---|---|
| 4,431,900 | 2/1984 | Delfino et al. | 357/23.11 |
| 4,553,153 | 11/1985 | McColgin et al. | 357/30 |
| 4,621,275 | 11/1986 | Ueno et al. | 357/30 |

FOREIGN PATENT DOCUMENTS 57-24171  2/1982  Japan .

OTHER PUBLICATIONS

"The Tungsten-Rich Region of the Tungsten-Molybdenum-Silicon system", B.S.A. Group Research Center, 1968, pp. 2–3.
Teranishi and Ishihara, IEEE Transactions on Electronic Devices, ED-34, 1052 (1987).

Primary Examiner—Rolf Hille
Assistant Examiner—Mahshid Saadat
Attorney, Agent, or Firm—Raymond L. Owens

[57] ABSTRACT

In interline transfer type image sensing devices, image smear is produced when light is allowed to penetrate into the charge transfer regions of the device. In this disclosure, a device with improved light shielding, and, hence, reduced smear, is described. The device incorporates $WSi_x$ (wherein $x<2$) refractory opaque material for the light shield which is placed in close proximity to the semiconductor surface, and a flowed glass planarization layer is disposed over the light shield.

1 Claim, 4 Drawing Sheets

FIG.B (PRIOR ART)

IMAGE SENSING DEVICE WITH REDUCED SMEAR

CROSS-REFERENCE TO RELATED APPLICATION

This application is a continuation-in-part of U.S. Ser. No. 570,185, filed Aug. 20, 1990, now abandoned, which is a continuation-in-part of U.S. Ser. No. 236,413, filed Aug. 25, 1988, now abandoned.

FIELD OF THE INVENTION

This invention relates to image sensing devices and, more particularly, to image sensing devices which collect photogenerated charge.

BACKGROUND OF THE INVENTION

In interline transfer type imaging devices, photogenerated charge is collected on a pn junction or under the gate of a photocapacitor for a period of time and then transferred into a charge coupled register to be detected by an output circuit. During the time required for the read-out operation, light is still incident on the photodiode or photocapacitor, and photogenerated charge is being collected and stored for the following frame. In this mode of operation, it is necessary to shield the shift registers and transfer gate regions from exposure to the incident light. Such exposure will produce spurious signals in the detected image, thus degrading the performance of the device. This unwanted exposure has been called "image smear" in the literature.

A variety of causes for image smear have been discussed and reviewed in a recent paper by Teranishi and Ishihara, IEEE Transactions on Electron Devices, ED-34, 1052, (1987). A significant cause of smear identified by these authors is due to a waveguide effect which occurs between the light shield layer of the device and the underlying polysilicon CCD gates. This effect is illustrated in FIG. 1a.

In FIG. 1a, a semiconductor substrate 10 of first conductivity type, typically n, contains a doped region 20 of a second, opposite, conductivity type, typically p, a barrier region 30 consisting of higher doping second type conductivity and thick insulator 60, a photodiode region 40 of first conductivity type, a transfer channel region 50 of first conductivity type, a charge transfer gate 70, an insulating layer 75 over both the transfer gate and the photodiode, a smoothing layer of insulator 80, opaque light shield layer 90 and a top protective insulator layer 100. Incident light rays 110 and 112, illustrated schematically, are able to penetrate into the transfer channel region of the device where electron-hole pairs may be produced. Charges so produced may be collected in the transfer channel 50 and read out along with the desired photogenerated charge which has been collected by the photodiode 40. This charge is unwanted and produces smear.

As Teranishi and Ishihara have noted, it is desirable to have thinner insulating layers between the light shield and the underlying semiconductor device in order to minimize the effects of light rays such as 110 and 112. Typically, a layer of phosphosilicate glass is used for this insulator, and the light shield is aluminum. Teranishi and Ishihara minimized the insulator thickness by only using a thermally grown oxide layer for the insulator. This is illustrated in FIG. 2 where an aluminum light shield 95 is separated from the gate electrode and photodiode by thermally grown oxide 75. In devices such as shown by Teranishi et al, the aluminum light shield 95 can be subject to hillock growth causing severe topographic features.

In image sensors for detecting color, however, a color filter pattern must still be fabricated over the light shield. The structure of FIG. 1, due to the topography of the surface, is not well suited for color filter application, and additional smoothing layers must be applied before applying the color filter array. Such smoothing layers are typically rather thick layers of spun-on organic materials which can present manufacturing problems due the thickness required, and can add to image smear and "color cross-talk" as described by McColgin and Pace, U.S. Pat. No. 4,553,153. The FIG. 1b surface has even more severe topographical features than the FIG. 1a structure.

In Japanese Published Application No. 57-24171 to Miyata dated Feb. 8, 1982, it has been disclosed to provide a refractory light shield made of a metal or its silicide. $WSi_2$ is one of the listed silicides. $WSi_2$ has good advantages, however, it produces a light shield with inadequate opacity at 3000 A or less. In other words, it permits too much light to pass into the substrate.

SUMMARY OF THE INVENTION

The present invention disclosure solves the light leakage induced image smear and the surface topography of the image sensor problems. In this invention, a refractory material is used as the light shielding layer, and this material may be covered by a doped oxide layer. Due to the refractory properties of the light shield, the doped oxide layer may be heated to a temperature which causes this layer to flow and, hence, to produce a smooth surface which is more suitable for uniform application of subsequent layers, such as color filters.

More specifically, in an image sensor device having a plurality of photodiodes for storing charge in response to actinic light, charge transfer devices for receiving the stored charge from different ones of the photodiodes, and, gate means disposed over the charge transfer devices and effective in a first condition for causing charge to transfer from the photodiodes and in a second condition for transferring charge along the transfer devices, the improvement comprising: (a) a thin oxide layer disposed over the photodiode and the gate means; (b) an opaque refractory light shield of 3000 A or less provided on the oxide layer over the gate means and formed of silicide of tungsten, $WSi_x$, where x is a number less than 2 and the stoichiometric phase $W_5Si_3$ is present in such light shield; and (c) a flowed glass layer disposed over the thin oxide over the photodiodes and the opaque refractory light shield providing a smooth surface suitable for subsequent fabrication of a color filter array.

The refractory material $WSi_x$ is advantageous for the light shield because it permits use of chemical vapor deposited oxides and heat treatment to cause flow of such oxides.

A feature of the invention is the unexpected opacity of $WSi_x$ ($x<2$).

BRIEF DESCRIPTION OF THE DRAWINGS

FIG. 1b is a fragmentary, partially schematic vertical section view through a semiconductor device, illustrating a prior art construction;

It will be appreciated that for purposes of various dimensions, particularly in the vertical direction, are quite small.

MODES OF CARRYING OUT THE INVENTION

Figure 1A:
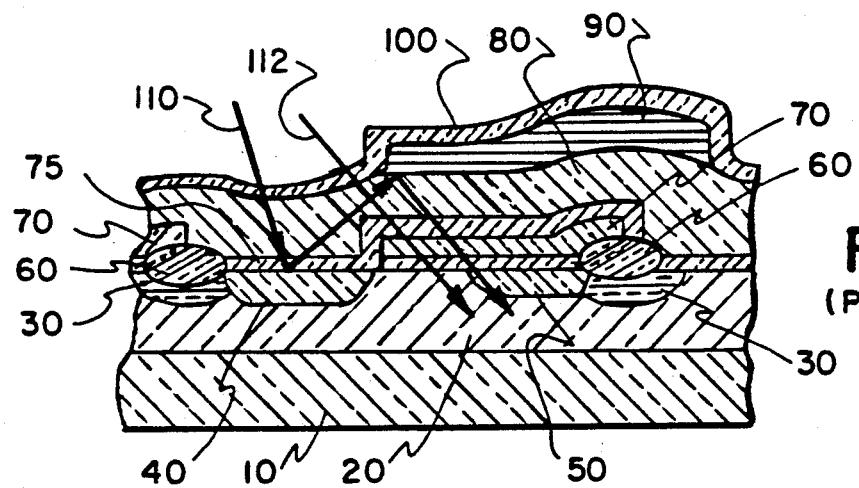
FIG. 1a is a fragmentary, partially schematic vertical section view through a semiconductor device, illustrating a prior art construction.
Figure 3A:
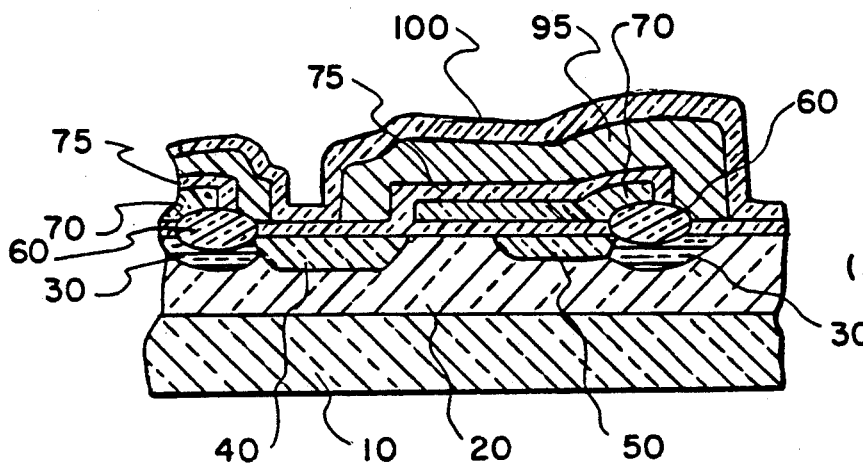
FIGS. 3a-c are fragmentary, partially schematic vertical section views through a semiconductor device, illustrating various steps in the process of making a device in accordance with the present invention.
Figure 3A:
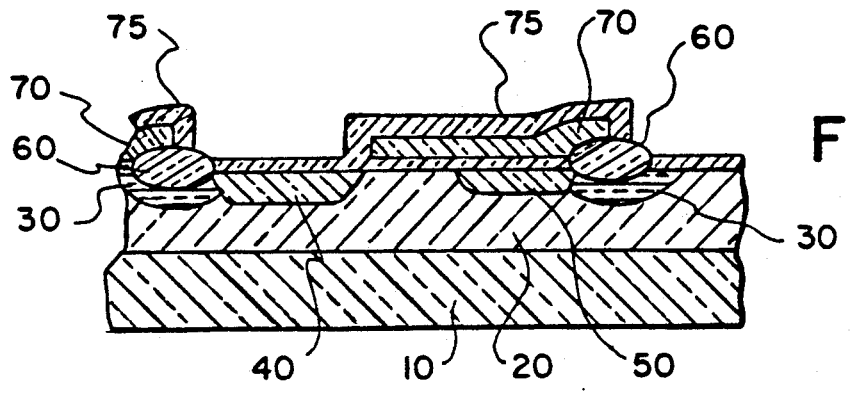

A semiconductor substrate is provided with a plurality of light sensing elements and charge transfer means as illustrated in FIG. 3a. This is similar to the arrangement in FIGS. 1a and 1b and need not be discussed further. Where elements correspond with FIGS. 1a and 1b, the same numbers will be used. A thin, opaque coating of a refractory material 72 is deposited and patterned to form openings for light rays using standard photomasking and etching techniques.

Such an opaque refractory light shield consists of WSi$_x$ where x is <2. During the deposition of such materials as silicides by sputtering, there is often a difference in stoichiometry between the target and the actual film deposited. Typically the concentration of Si in the films is less than that in the target. For this reason, it is essential to have a target composition that contains Si in excess of that desired in the films. The properties of the deposited films vary with the silicon concentration. One such property is the transparency of the film. It turns out that for the stoichiometry suggested in the above referenced Japanese patent application to Miyata, WSi$_2$, the transparency is too high to permit the use of a 3000 A or less layer thickness for smear reduction. The average composition of the film must be WSi$_x$ with x<2 for an adequate coefficient of absorption. In fact, the presence of the stoichiometric phase W$_5$Si$_3$ in the light shield is essential for obtaining adequate "smear reduction". It should be noted that W$_5$Si$_3$ corresponds to WSi$_x$, with x=0.6. This phase is always present when the average value of x is less than two (<2). The device is then coated with an insulating layer 85 which, when subject to high temperatures, will flow to form a smoother surface 86 as in FIG. 3c. This insulating layer 85 is made of glass that flows in response to elevated temperatures, such as to a doped oxide such as boro phosphosilicate glass where boron and phosphorus weight percentages are in the range of 3 to 7 percent.

Other such layers may be phosphosilicate glass with weight percent phosphorus in the range of 4 to 10 percent.

Figure 2:
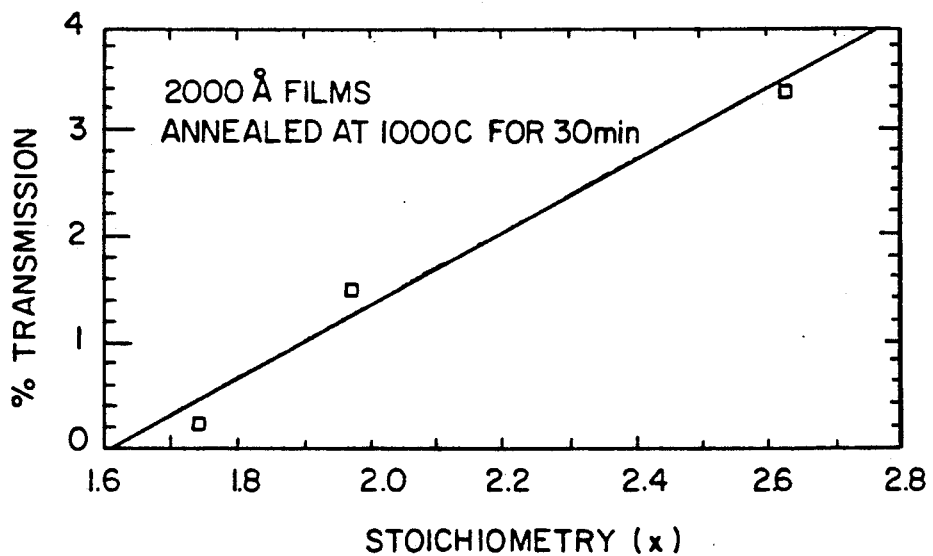
FIG. 2 shows the variation of the percent of transparency of 2000 A WSi$_x$ films as a function of x, the Si concentration.

FIG. 2 shows the percent transparency of annealed at 1000° C. for 30 minutes. The abscissa plots the silicon concentration (the x is WSi$_x$) as measured analytically. It is apparent that the transmission falls rapidly as the silicon concentration is reduced. To reduce/eliminate smear, it is essential that the transmission be as low as possible. X-ray analysis identified the presence of W$_5$Si$_3$ in the film with x=1.74. Theoretical considerations argue that this phase (W$_5$Si$_3$) would be present whenever x is less than 2.0, and increased amounts of this phase would result in lower transmission.

Figure 3B:
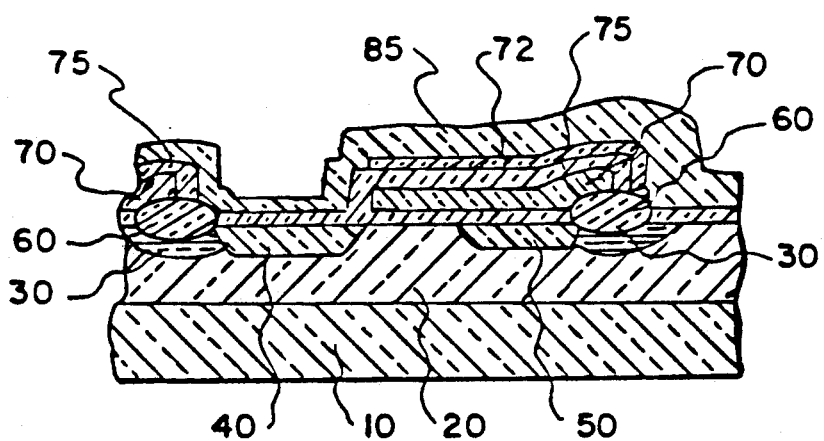
Figure 3C:
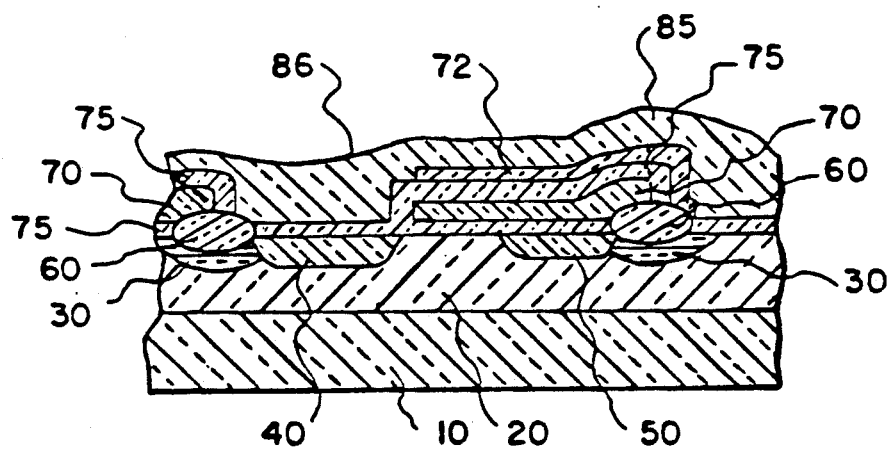

In FIG. 3b we see that the surface of layer 85 has severe topographical features. The surface 86 of FIG. 3c is quite smooth and facilitates the fabrication of color filter arrays.

Figure 4:
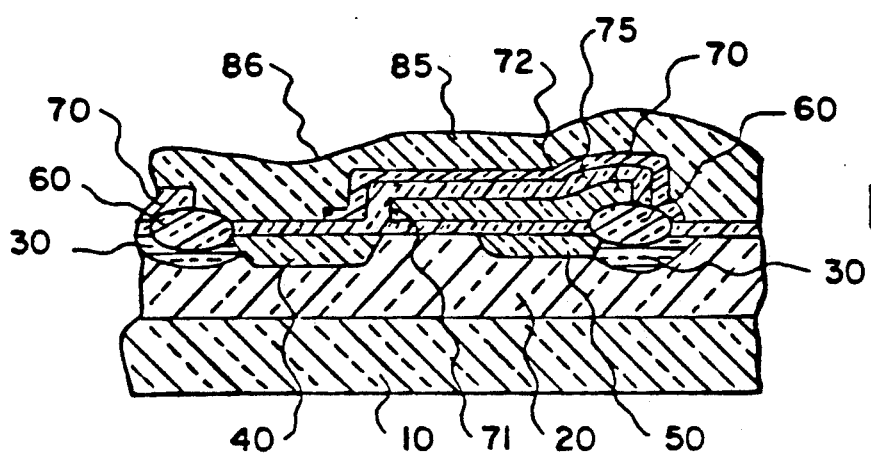
FIG. 4 is a fragmentary, partially schematic vertical section view through a semiconductor device, illustrating an alternative embodiment of the present invention.

An alternative patterning of the layer 72 is illustrated in FIG. 4 where the end regions 71 of the transfer gate may be covered, and the thicker insulating region 60 may also be covered.

Figure 5:
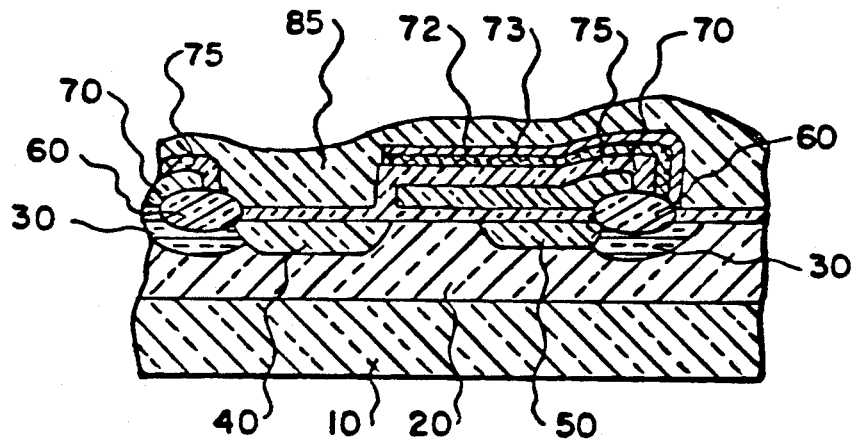
FIG. 5 is a fragmentary, partially schematic vertical section view through a semiconductor device, illustrating another alternative embodiment of the present invention.

An additional layer in the light shield material may be incorporated as shown in FIG. 5 where the added layer 73 may be polysilicon. It may be desirable to incorporate such an additional layer in order to improve adhesion of the opaque material 70 or to provide a stress relief layer between layer 70 and the substrate. Subsequently, a color filter array can be applied according to procedures described by the Pace et al published European Application No. EP 249991.

Figure 6:
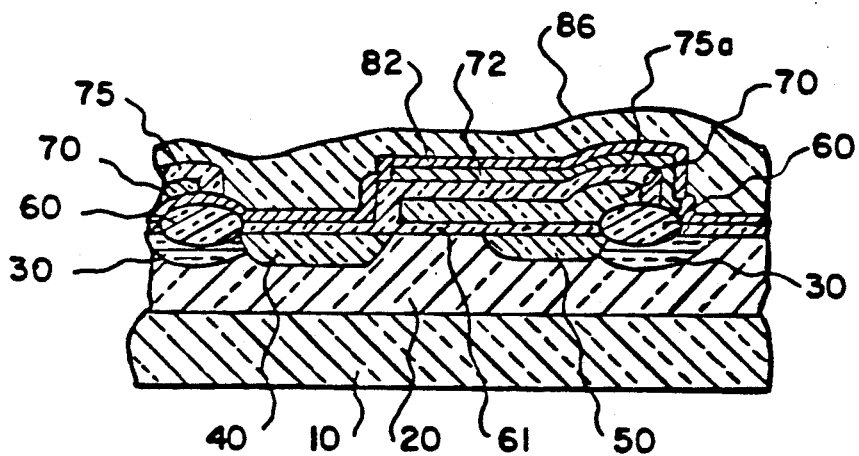
FIG. 6 is a fragmentary, partially schematic vertical section view through another interline transfer charge coupled imaging device fabricated according to this invention.

Turning now to FIG. 6, we see a structure similar to FIG. 3b. In FIG. 6, however, a glass layer 82 is deposited prior to glass layer 85.

Such glass layer may be pure SiO$_2$ and may serve to protect the underlying layers from adverse interaction with the dopants contained in glass layer 85.

EXAMPLE

The following description gives an example of a device which was made and is illustrated in FIG. 6:

An n-type semiconductor 10 doped to approximately 30 ohm-cm resistivity was provided with a p-type region 20 by implantation of boron atoms with a dose of 1.0E+12 cm$^{-2}$ and diffused to a depth of thickness t1, approximately 3.5 um. Channel stop barrier regions were formed by implantation of boron into region 30 with a dose of 1.0E+13 cm$^{-2}$ and subsequently growing an oxide 60 (SiO$_2$) of a thickness approximately 4000 A. An additional oxidation and subsequent etch-back reduced oxide 60 to a thickness of approximately 2500 A. A transfer channel region 50 was formed by ion implantation of phosphorus atoms, with a total dose 3.25E.12 cm$^{-2}$, and transfer gate oxide 61, approximately 500 A thick, grown in the charge transfer region and over the photodiode region. A polysilicon electrode 70 then was formed according to procedures described by Losee et al, in U.S. Pat. No. 4,613,402, and phosphorus was implanted into the photodiode region with a dose of 7.0E+12 cm$^{-2}$. A thin oxide layer 75 and 75a was grown at a temperature of 950° C., in a wet ambient, for approximately 8 minutes, and a layer 72 of approximate composition WSi$_x$, x<2, and thickness approximately 3000 A deposited by sputtering from a target composition of WSi$_{2.3}$. Subsequent analysis by x-ray diffraction showed the presence of W$_5$Si$_3$ indicating that the average composition was WSi$_x$ with x<2. Insulating glass layer 82 was deposited by chemical vapor deposition, consisting of approximately 1000 A undoped oxide covered by 5000 A of oxide doped with approximately 4 wt% boron and 4 wt% phosphorus. The device was subsequently annealed in an inert ambient for 30 minutes at a temperature of 1000° C. The opacity of the light shield resulted in satisfactory smear reduction.

The invention has been described in detail with particular reference to preferred embodiments thereof, but it will be understood that variations and modifications can be effected within the spirit and scope of the invention.

What is claimed is:

1. In an image sensor device having a plurality of photodiodes for storing charge in response to actinic light, charge transfer devices for receiving the stored charge from different ones of the photodiodes, and, gate means disposed over the charge transfer devices and effective in a first condition for causing charge to transfer from the photodiodes and in a second condition for transferring charge along the transfer devices, the improvement comprising:

(a) a thin oxide layer disposed over the photodiode and the gate means;

(b) an opaque refractory light shield of 3000 A or less provided on the oxide layer over the gate means and formed of silicide of tungsten, $WSi_x$, where x is a number less than 2 and $W_5Si_3$ is present in such light shield; and (c) a flowed glass layer disposed over the thin oxide over the photodiodes and the opaque refractory light shield providing a smooth surface suitable for subsequent fabrication of a color filter array.

* * * * *